(12) United States Patent
Luo

(10) Patent No.: US 11,158,691 B1
(45) Date of Patent: Oct. 26, 2021

(54) DISPLAY DEVICE AND METHOD FOR MANUFACTURING SAME

(71) Applicant: WUHAN CHINA STAR OPTOELECTRONICS SEMICONDUCTOR DISPLAY TECHNOLOGY CO., LTD., Wuhan (CN)

(72) Inventor: Jiajia Luo, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 189 days.

(21) Appl. No.: 16/623,087

(22) PCT Filed: Aug. 30, 2019

(86) PCT No.: PCT/CN2019/103509
§ 371 (c)(1),
(2) Date: Dec. 16, 2019

(87) PCT Pub. No.: WO2021/000413
PCT Pub. Date: Jan. 7, 2021

(30) Foreign Application Priority Data

Jul. 4, 2019 (CN) .......................... 201910598013.6

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 27/3234* (2013.01); *H01L 51/0097* (2013.01); *H01L 51/56* (2013.01); *H01L 2227/323* (2013.01)

(58) Field of Classification Search
CPC ............. H01L 27/3234; H01L 27/3246; H01L 51/0097; H01L 51/56
USPC .......................................................... 257/40
See application file for complete search history.

(56) References Cited

U.S. PATENT DOCUMENTS

| 10,853,618 | B2 * | 12/2020 | Ko ......... | H01L 31/153 |
| 2018/0040675 | A1 * | 2/2018 | Zeng ......... | H01L 27/3246 |
| 2018/0158877 | A1 * | 6/2018 | Zeng ......... | G06K 9/0004 |

* cited by examiner

*Primary Examiner* — David Vu
*Assistant Examiner* — Brandon C Fox
(74) *Attorney, Agent, or Firm* — Osha Bergman Watanabe & Burton LLP

(57) ABSTRACT

A display device and method for manufacturing the same are provided. The display device includes a display screen and a camera disposed under the display screen. The display screen includes a flexible substrate layer, a thin film transistor substrate, a pixel defining layer, and a light emitting layer which are sequentially laminated. The camera includes a detector, an optical fiber detector, and an optical fiber for connecting the detector and the optical fiber detector. The manufacturing method of the display device includes the steps of: providing a display screen, providing a through hole, and providing a camera.

10 Claims, 3 Drawing Sheets

DISPLAY DEVICE AND METHOD FOR MANUFACTURING SAME

FIELD OF INVENTION

This disclosure relates to touch display technology, and more particularly, to a display device and a method for manufacturing the display device.

BACKGROUND OF INVENTION

It is a difficult for mobile phone manufacturers and panel manufacturers to overcome a problem of increasing a screen ratio of mobile phone display screens. Due to a front camera, an absolute full screen has been difficult to achieve.

At present, for a camera under panel (CUP) design, a method of proceeding a hollowing out an organic light-emitting diode (OLED) can realize disposal of a camera under a screen. However, the hollowing out process will affect a life-time of the screen, and display effect will be defective, thus there has been no good development for solving the problem. Another solution is to make the OLED into a translucent area. When the camera is turned on, the OLED above the camera is controlled by an array not to emit light, and can emit light during a normal display state, thus realizing a full screen is realized, but this also leads to a display drawback for the screen when the camera is turned on. One display effect of the translucent area above the camera is that there is a large difference in display effect from other areas of the screen.

Therefore, it is necessary to provide a novel display screen to overcome the drawbacks of the conventional technology.

SUMMARY OF INVENTION

An object of this disclosure is to provide a display device, in which a camera is disposed under a display screen, and an optical fiber detector is disposed in a non-light-emitting area above the display screen. The optical fiber detector is connected to the camera by providing an optical fiber in the non-light-emitting area, so that an optical path of the camera does not interfere with an optical path of the display screen. A full screen display effect can be realized, and a multi-angle image of the camera can be realized at the same time. Another object of this disclosure provides a method for manufacturing a display device. The camera is disposed under the display screen, and the optical fiber detector is disposed in the non-light-emitting area above the display. The optical fiber detector is connected to the camera by providing an optical fiber in the non-light-emitting area, so that an optical path of the camera does not interfere with an optical path of the display screen. A full screen display effect can be realized, and a multi-angle image of the camera can be realized at the same time.

In order to achieve the above objects, this disclosure provides a display device. The display device comprises a display screen and a camera disposed under the display screen. The display screen includes a flexible substrate layer, a thin film transistor substrate, a pixel defining layer, and a light emitting layer which are sequentially laminated. Specifically, the thin film transistor substrate is disposed on the flexible substrate layer, the pixel defining layer is disposed on the thin film transistor substrate, and the pixel defining layer comprises a pixel defining structure and a pixel defining groove formed by being surrounded by the pixel defining structure. The light emitting layer is disposed in the pixel defining groove.

The camera comprises a detector, an optical fiber detector, and an optical fiber for connecting the detector and the optical fiber detector. Specifically, the detector is disposed under the flexible substrate layer, and the detector corresponds to the light emitting layer. The optical fiber detector is disposed on an upper surface of the pixel defining structure for receiving an optical signal. The optical fiber is disposed opposite to the pixel defining structure, and the optical fiber is disposed through the display screen for connecting the detector and the optical fiber detector to transmit the optical signal.

Furthermore, the display screen further comprises a through hole formed through the display screen, the through hole is corresponding to the pixel defining structure, and the optical fiber is disposed in the through hole.

Furthermore, a material of the flexible substrate layer comprises a polyimide layer.

Furthermore, the thin film transistor substrate comprises a flexible substrate, a buffer layer, an active layer, a gate insulating layer, a gate layer, an interlayer insulating layer, a source/drain layer, a planarization layer, and an anode layer which are sequentially laminated.

Furthermore, the anode layer is electrically connected to the light emitting layer.

Furthermore, a material of the active layer comprises low temperature polysilicon.

The disclosure further provides a method for manufacturing a display device. The method comprises the step of: forming a display screen, wherein the steps of forming the display screen comprising: providing a flexible substrate layer, and sequentially forming a thin film transistor substrate, a pixel defining layer, and a light emitting layer on the flexible substrate layer; and wherein a pixel defining structure is formed on the pixel defining layer and a pixel defining groove is formed by being surrounded by the pixel defining structure, the light emitting layer is disposed in the pixel defining groove; and providing a camera, wherein the camera comprises a detector, an optical fiber detector, and an optical fiber; and wherein the detector is disposed under the flexible substrate layer and corresponds to the light emitting layer, the optical fiber detector is disposed on the pixel defining layer, and the optical fiber passes through the display screen to connect the detector to the optical fiber detector.

Furthermore, the method further comprises a step of forming a through hole, and wherein the through hole is disposed on the display screen, the through hole corresponds to a pixel defining structure of the pixel defining layer, and the optical fiber is disposed in the through hole.

Furthermore, the step of providing the camera further comprises:

providing the detector, wherein the detector is disposed under the flexible substrate layer;

providing the optical fiber detector, wherein the optical fiber detector is disposed on the pixel defining structure; and providing the optical fiber, wherein a length of the optical fiber is greater than a thickness of the display screen, and the optical fiber is passed through the through hole to connect the detector to the optical fiber detector.

Furthermore, the step of forming the thin film transistor substrate further comprises:

providing a flexible substrate;

forming a buffer layer on the flexible substrate;

forming an active layer on the buffer layer, wherein a material of the active layer comprises low temperature polysilicon, and the active layer is doped to form a source region and a drain region on the active layer;

forming a gate insulating layer on the active layer;

forming a gate layer on the gate insulating layer;

forming an interlayer insulating layer on the gate layer;

forming a source/drain layer on the gate layer, wherein the source/drain layer include a source and a drain;

forming a planarization layer on the source/drain layer; and forming an anode layer on the planarization layer, wherein the anode layer is correspondingly disposed and electrically connected to the active layer, and the anode layer is connected to the light-emitting layer.

Advantageous effects of the disclosure are as follows. The disclosure provides a display device and a method for manufacturing the display device. A camera is disposed under a display screen, and an optical fiber detector is disposed at a pixel defining structure of a non-light-emitting area above the display screen. The optical fiber detector is connected to the camera by providing an optical fiber in the non-light-emitting area, so that an optical path of the camera does not interfere with an optical path of the display screen. A full screen display effect can be realized, and a multi-angle image of the camera can be realized at the same time.

100, display device; 10, display screen; 20, camera;

1, flexible substrate layer; 2, thin film transistor substrate; 3 pixel defining layer; 4, light emitting layer;

5, detector; 6, optical fiber detector; 7, optical fiber; 8, through hole; 21, flexible substrate;

22, buffer layer; 23, active layer; 24, gate insulating layer; 25, gate layer;

26, interlayer insulating layer; 27, source/drain layer; 28, planarization layer; 29, anode layer;

31, pixel defining structure; 32, pixel defining groove.

DETAILED DESCRIPTION OF PREFERRED EMBODIMENTS

In this disclosure, a first feature "on" or "under" a second feature may include direct contact of the first feature and the second feature, and it may also be included that the first feature and the second feature are not in direct contact but are contacted by additional features between them, unless otherwise specifically defined and limited. Moreover, the first feature "on", "above" and "upper" the second feature includes the first feature directly above and obliquely upward the second feature, or merely indicates that a level of the first feature is higher than a level of the second feature. The first feature "lower", "below" and "under" the second feature includes the first feature directly below and obliquely downward the second feature, or merely indicates that a level of the first feature is less than a level of the second feature.

In this disclosure, the term "a plurality" refers to two or more, unless otherwise specified. In addition, the term "comprises" and its variations are intended to cover a non-exclusive inclusion.

In the description of this disclosure, it should be noted that the terms "dispose", "arrange", "connected", and "connection" are to be understood broadly, unless otherwise specified and defined. For example, it can be a fixed connection, a detachable connection, or an integrated connection. It also can be a mechanical connection or an electrical connection. It further can be directly connected, or indirectly connected through an intermediate medium. It still can be an internal connection between the two elements. The specific meaning of the above terms in the disclosure can be understood in specific circumstances by those skilled in the art.

Figure 1:
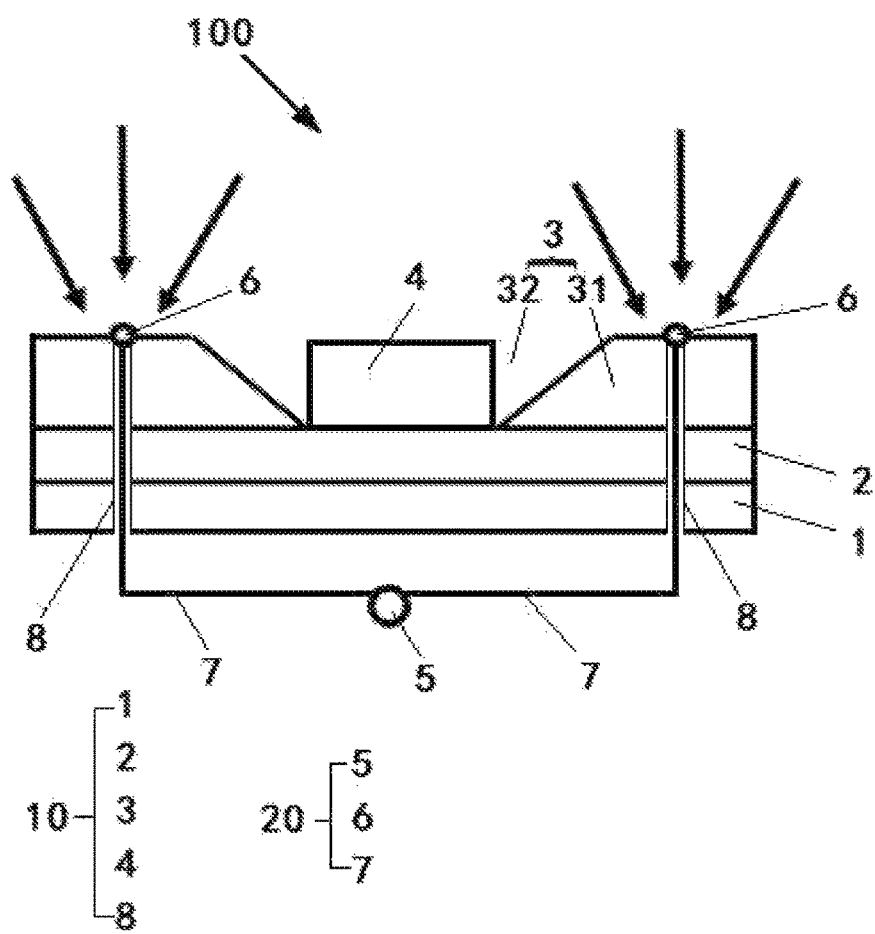
FIG. 1 is a schematic structural diagram of a display device in an embodiment of the disclosure.

Referring to FIG. 1, this disclosure provides a display device 100. The display device 100 comprises a display screen 10 and a camera 20 disposed under the display screen 10.

The display screen 10 includes a flexible substrate layer 1, a thin film transistor substrate 2, a pixel defining layer 3, and a light emitting layer 4 which are sequentially laminated. Specifically, the thin film transistor substrate 2 is disposed on the flexible substrate layer 1, the pixel defining layer 3 is disposed on the thin film transistor substrate 2, and the pixel defining layer 3 comprises a pixel defining structure 31 and a pixel defining groove 32 formed by being surrounded by the pixel defining structure 31. The light emitting layer 4 is disposed in the pixel defining groove 32.

The camera 20 comprises a detector 5, an optical fiber detector 6, and an optical fiber 7 for connecting the detector and the optical fiber detector. Specifically, the detector 5 is disposed under the flexible substrate layer 1, and the detector 5 corresponds to the light emitting layer 4. The optical fiber detector 6 is disposed on the pixel defining structure 31 for receiving an optical signal (arrows shown in FIG. 1). The optical fiber 7 is disposed through the display screen 10 for connecting the detector 5 and the optical fiber detector 6 to transmit the optical signal.

It can be understood that an area corresponding to the light emitting layer 4 in the display screen 10 is a light emitting area, the light emitting layer 4 emits light as a light source, and an area corresponding to the pixel defining structure 31 is a non-light-emitting area. In this disclosure, the camera 20 is disposed under the display screen 10. Preferably, the detector 5 of the camera 20 is disposed below the display screen 10 at a position corresponding to the light-emitting area. The optical fiber detector 6 is disposed at the pixel defining structure 31 of the non-light-emitting area above the display screen 10, and the optical fiber 7 is disposed in the non-light emitting area to connect the optical fiber detector 6 to the camera 20. Therefore, an optical path of the camera 20 does not interfere with an optical path of the display screen 10. A full screen display effect can be realized, and a multi-angle image of the camera 20 can be realized at the same time. Moreover, because the optical fiber detector 6 is arranged in a full screen manner, a full screen display effect is realized, and the full screen imaging display and the multi-angle full screen imaging display can be realized at the same time. Further, a 180° full-angle imaging effect can be realized.

In this embodiment, the display screen 10 further comprises a through hole 8 is configured to pass through the display screen 10, the through hole 8 is corresponding to the pixel defining structure 31. More specifically, the through hole 8 is formed at the pixel defining structure 31 and penetrates the display screen 10, and the optical fiber 7 is disposed in the through hole 8.

In the embodiment, a material of the flexible substrate layer 1 comprises a polyimide layer.

Figure 2:
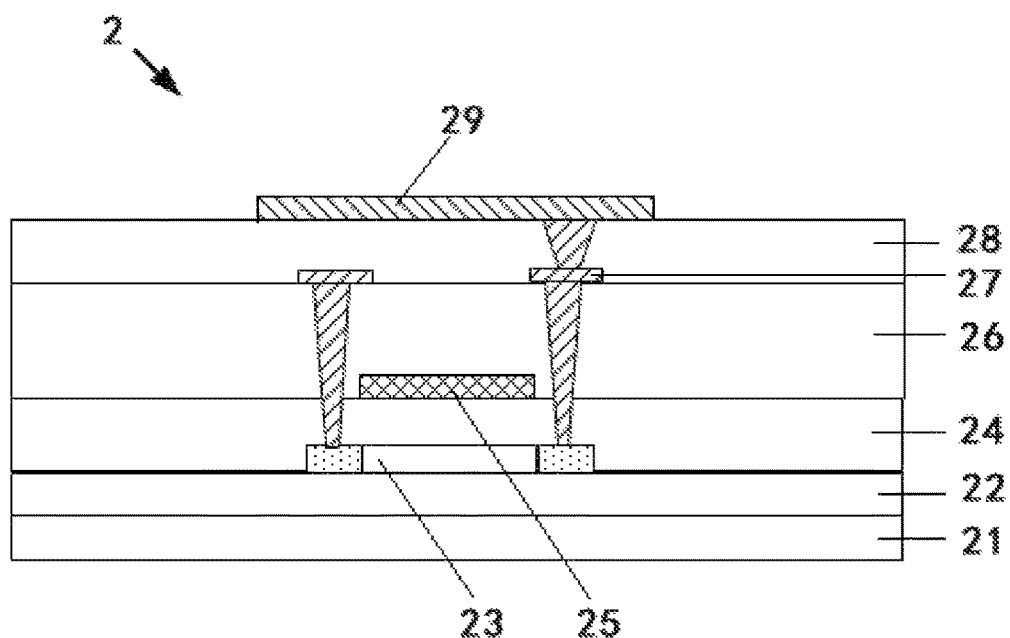
FIG. 2 is a schematic structural diagram of a thin film transistor substrate of FIG. 1.

Referring to FIG. 2, in the embodiment, the thin film transistor substrate 2 includes a flexible substrate 21, a buffer layer 22, an active layer 23, a gate insulating layer 24, a gate layer 25, and an interlayer insulating layer 26, a source/drain layer 27, a planarization layer 28, and anode layer 29 which are disposed in a stacked manner.

Figure 3:
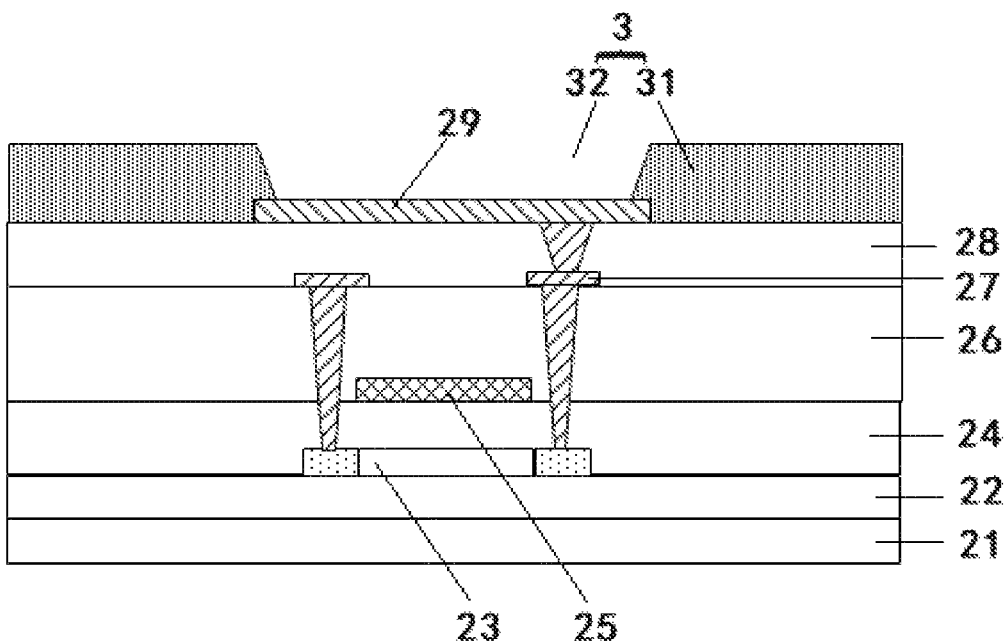
FIG. 3 is a schematic structural diagram of the thin film transistor substrate and the pixel defining layer of FIG. 1.

Referring to FIG. 3, FIG. 3 is a schematic structural diagram indicating the positional relationship between the thin film transistor substrate 2 and the pixel defining layer 3 according to the embodiment. The anode layer 29 is disposed at a bottom portion of the pixel defining groove 32, and the anode layer 29 is electrically connected to the light emitting layer 4.

In this embodiment, a material of the active layer 23 includes low temperature polysilicon. The active layer 23 includes a source region and a drain region. The source/drain layer 27 includes a source and a drain.

Figure 4:
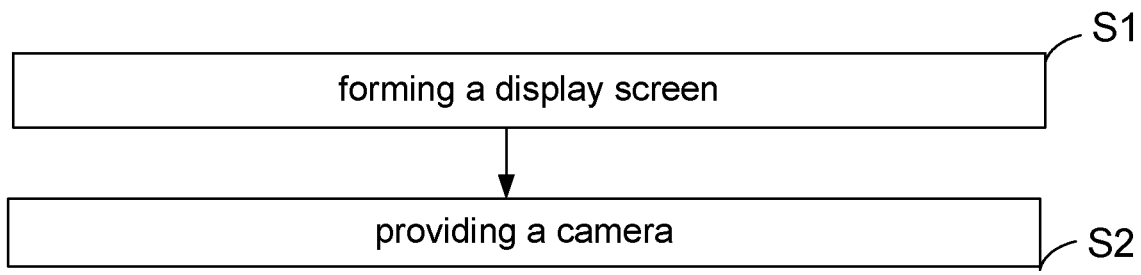
FIG. 4 is a flowchart of a method for manufacturing the display device in an embodiment of the disclosure.

Referring to FIG. 4, the disclosure further provides a method for manufacturing the display device 100, including the following steps S1-S2.

In the step S1, a display screen 10 is formed. The steps of forming the display screen comprising: providing a flexible substrate layer 1, and sequentially forming a thin film transistor substrate 2, a pixel defining layer 3, and a light emitting layer 4 on the flexible substrate layer 1. Specifically, the thin film transistor substrate 2 is disposed on the flexible substrate layer 1. The pixel defining layer 3 is disposed on the thin film transistor substrate 2. A pixel defining structure 31 is formed on the pixel defining layer 3 and a pixel defining groove 32 is formed by being surrounded by the pixel defining structure 31. The light emitting layer 4 is disposed in the pixel defining groove 32.

In the step S2, a camera 20 is provided. The camera 20 comprises a detector 5, an optical fiber detector 6, and an optical fiber 7 for connecting the detector and the optical fiber detector. The detector 5 is disposed under the flexible substrate layer 1 and corresponds to the light emitting layer 4, the optical fiber detector 6 is disposed on the pixel defining layer, and the optical fiber 7 passes through the display screen 10 to connect the detector 5 to the optical fiber detector 6.

In this embodiment, the method for manufacturing the display screen 10 further comprises a step of forming a through hole 8. The through hole 8 is disposed on the display screen 10, and the through hole 8 corresponds to the pixel defining structure 31. Specifically, through holes 8 are formed in each of the flexible substrate 21, the thin film transistor substrate 2, and the pixel defining structure 31 of the pixel defining layer 3, and the through hole 8 penetrates the display screen 10. The optical fiber 7 is disposed in the through hole 8.

Figure 5:
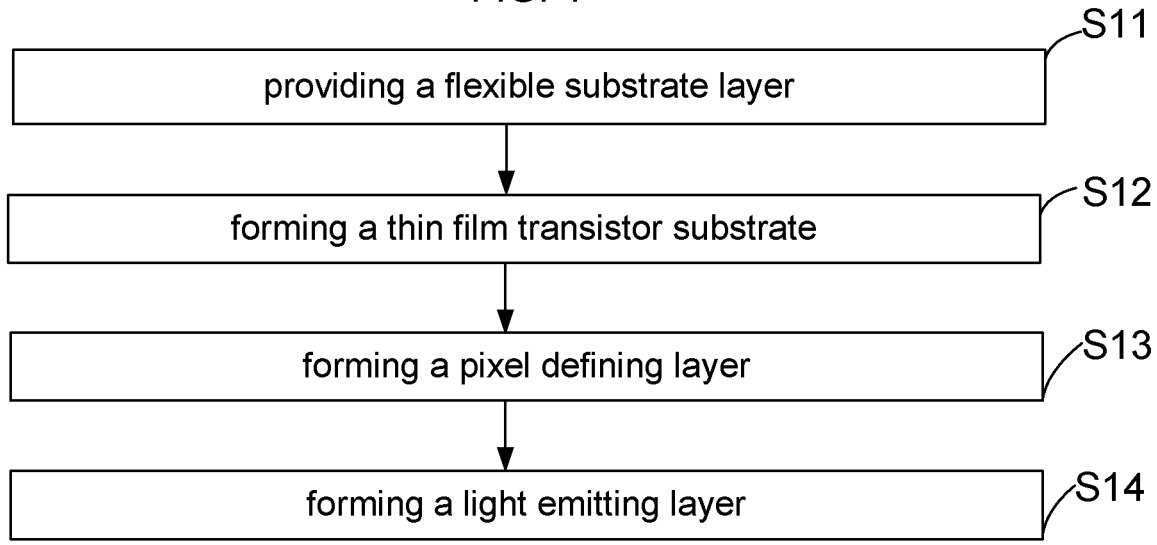
FIG. 5 is a flowchart of the steps of manufacturing a display screen according to FIG. 4.

Referring to FIG. 5, in the embodiment, the step S1 for manufacturing the display screen 10 specifically comprises the following steps.

In a step S11, the flexible substrate layer is provided.

In a step S12, the thin film transistor substrate 2 is provided. The thin film transistor substrate 2 is formed on the flexible substrate layer.

In a step S13, the pixel defining layer 3 is formed. The pixel defining layer 3 is formed on the thin film transistor substrate 2. The pixel defining structure 31 is formed on the pixel defining layer 3 and a pixel defining groove 32 is formed by being surrounded by the pixel defining structure 31.

In a step S14, the light emitting layer 4 is formed, and the light emitting layer 4 is formed in the pixel defining groove 32.

Figure 6:
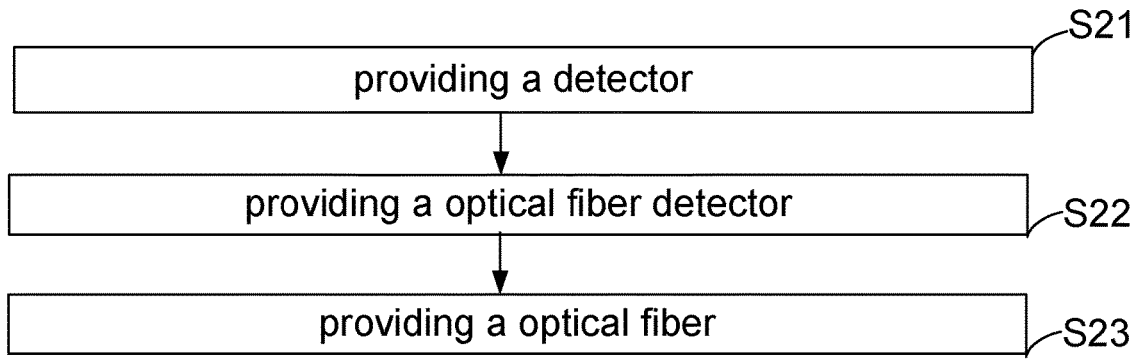
FIG. 6 is a flowchart of the steps of disposing a camera according to FIG. 4.

Referring to FIG. 6, in the embodiment, the step S2 of manufacturing the camera 20 comprises the following steps.

In a step S21, the detector 5 is provided. The detector 5 is disposed under the flexible substrate layer 1.

In a step S22, the optical fiber detector 6 is provided. The optical fiber detector 6 is disposed on the pixel defining structure 31.

In a step S23, the optical fiber 7 is provided. A length of the optical fiber 7 is greater than a thickness of the display screen 10, and the optical fiber 7 is passed through the through hole 8 to connect the detector 5 to the optical fiber detector 6.

Figure 7:
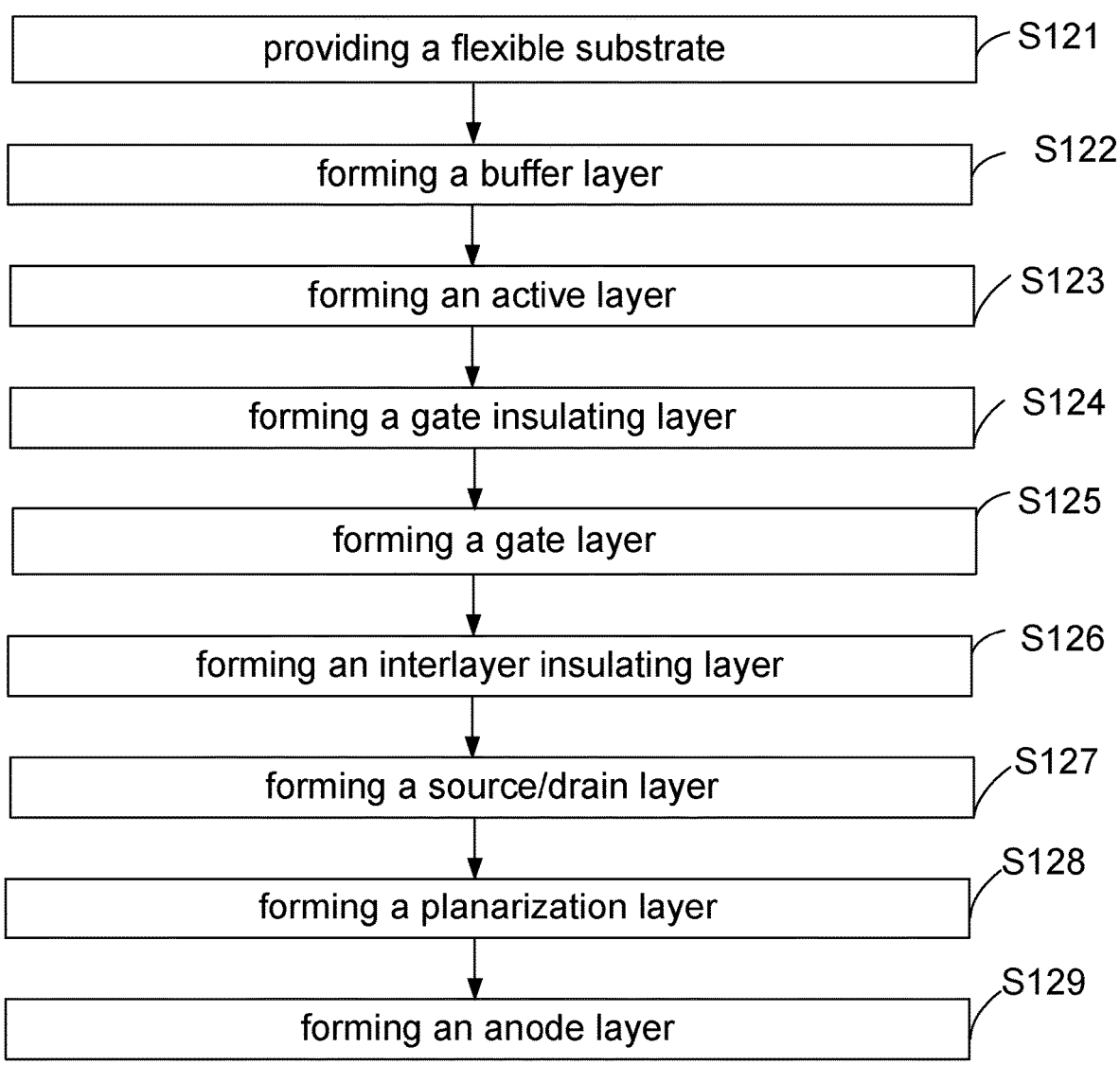
FIG. 7 is a flowchart of the steps of manufacturing the thin film transistor substrate according to FIG. 5.

Referring to FIG. 7, in the embodiment, the step S12 of manufacturing the thin film transistor substrate 2 comprises the following steps.

In a step S121, a flexible substrate 21 is provided.

In a step S122, a buffer layer 22 is formed. The buffer layer 22 is formed on the flexible substrate 21.

In a step S123, an active layer 23 is formed. The active layer 23 is formed on the buffer layer 22. A material of the active layer 23 includes low temperature polysilicon, and the active layer 23 is doped to form a source region and a drain region on the active layer 23.

In a step S124, a gate insulating layer 24 is formed. The gate insulating layer 24 is formed on the active layer 23.

In a step S125, a gate layer 25 is formed. The gate layer 25 is formed on the gate insulating layer 24.

In a step S126, an interlayer insulating layer 26 is formed. The interlayer insulating layer 26 is formed on the gate layer 25.

In a step S127, a source/drain layer 27 is formed. The source/drain layer 27 is formed on the gate layer 25, and the source/drain layer 27 comprises a source and a drain.

In a step S128, a planarization layer 28 is formed. The planarization layer 28 is formed on the source/drain layer 27.

In a step S129, an anode layer 29 is formed. The anode layer 29 is formed on the planarization layer 28. The anode layer 29 is correspondingly disposed and electrically connected to the active layer 23, and the anode layer 29 is connected to the light-emitting layer 4.

Advantageous effects of the disclosure are as follows. The disclosure provides a display device and a method for manufacturing the display device. A camera is disposed under a display screen, and an optical fiber detector is disposed at a pixel defining structure of a non-light-emitting area above the display screen. The optical fiber detector is connected to the camera by providing an optical fiber in the non-light-emitting area, so that an optical path of the camera does not interfere with an optical path of the display screen. A full screen display effect can be realized, and a multi-angle image of the camera can be realized at the same time. Moreover, because the optical fiber detector is arranged in a full screen manner, a full screen display effect is realized, and the full screen imaging display and the multi-angle full screen imaging display can be realized at the same time. Further, a 180° full-angle imaging effect can be realized.

This disclosure has been described with preferred embodiments thereof, and it is understood that many changes and modifications to the described embodiment can be carried out without departing from the scope and the spirit of the invention.

What is claimed is:

1. A display device, comprising: a display screen and a camera;
   wherein the display screen comprises:
   a flexible substrate layer;
   a thin film transistor substrate disposed on the flexible substrate layer;
   a pixel defining layer disposed on the thin film transistor substrate, wherein the pixel defining layer comprises a pixel defining structure and a pixel defining groove formed by being surrounded by the pixel defining structure; and
   a light emitting layer disposed in the pixel defining groove; and
   wherein the camera comprises:
   a detector disposed under the flexible substrate layer, wherein the detector is corresponding to the light emitting layer;
   an optical fiber detector disposed on the pixel defining structure for receiving an optical signal; and
   an optical fiber is disposed through the display screen for connecting the detector and the optical fiber detector to transmit the optical signal.

2. The display device according to claim 1, wherein the display screen further comprises a through hole formed through the display screen, the through hole is corresponding to the pixel defining structure, and the optical fiber is disposed in the through hole.

3. The display device according to claim 1, wherein a material of the flexible substrate layer comprises a polyimide layer.

4. The display device according to claim 1, wherein the thin film transistor substrate comprises a flexible substrate, a buffer layer, an active layer, a gate insulating layer, a gate layer, an interlayer insulating layer, a source/drain layer, a planarization layer, and an anode layer which are sequentially laminated.

5. The display device according to claim 4, wherein the anode layer is electrically connected to the light emitting layer.

6. The display device according to claim 4, wherein a material of the active layer comprises low temperature polysilicon.

7. A method for manufacturing a display device, comprising:
   forming a display screen, wherein the steps of forming the display screen comprising: providing a flexible substrate layer, and sequentially forming a thin film transistor substrate, a pixel defining layer, and a light emitting layer on the flexible substrate layer; and wherein a pixel defining structure is formed on the pixel defining layer and a pixel defining groove is formed by being surrounded by the pixel defining structure, the light emitting layer is disposed in the pixel defining groove; and
   providing a camera, wherein the camera comprises a detector, an optical fiber detector, and an optical fiber; and wherein the detector is disposed under the flexible substrate layer and corresponds to the light emitting layer, the optical fiber detector is disposed on the pixel defining layer, and the optical fiber passes through the display screen to connect the detector to the optical fiber detector.

8. The method according to claim 7, wherein the method further comprises a step of forming a through hole, and wherein the through hole is disposed on the display screen, the through hole corresponds to a pixel defining structure of the pixel defining layer, and the optical fiber is disposed in the through hole.

9. The method according to claim 8, wherein the step of providing the camera further comprises:
   providing the detector, wherein the detector is disposed under the flexible substrate layer;
   providing the optical fiber detector, wherein the optical fiber detector is disposed on the pixel defining structure; and
   providing the optical fiber, wherein a length of the optical fiber is greater than a thickness of the display screen, and the optical fiber is passed through the through hole to connect the detector to the optical fiber detector.

10. The method according to claim 8, wherein the step of forming the thin film transistor substrate further comprises:
    providing a flexible substrate;
    forming a buffer layer on the flexible substrate;
    forming an active layer on the buffer layer, wherein a material of the active layer comprises low temperature polysilicon, and the active layer is doped to form a source region and a drain region on the active layer;
    forming a gate insulating layer on the active layer;
    forming a gate layer on the gate insulating layer;
    forming an interlayer insulating layer on the gate layer;
    forming a source/drain layer on the gate layer, wherein the source/drain layer comprises a source and a drain;
    forming a planarization layer on the source/drain layer; and
    forming an anode layer on the planarization layer, wherein the anode layer is correspondingly disposed and electrically connected to the active layer, and the anode layer is connected to the light emitting layer.

* * * * *